(12) United States Patent
Redgrave

(10) Patent No.: US 7,969,184 B1
(45) Date of Patent: Jun. 28, 2011

(54) CONFIGURABLE HIGH SPEED HIGH VOLTAGE INPUT/OUTPUT CIRCUIT FOR AN IC

(75) Inventor: Jason Redgrave, Mountain View, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

(21) Appl. No.: 12/032,638

(22) Filed: Feb. 15, 2008

Related U.S. Application Data

(60) Provisional application No. 60/970,518, filed on Sep. 6, 2007.

(51) Int. Cl.
*H03K 19/173* (2006.01)
(52) U.S. Cl. ............................ 326/38; 326/40; 326/46
(58) Field of Classification Search .............. 326/38–41, 326/46, 47
See application file for complete search history.

(56) References Cited

U.S. PATENT DOCUMENTS

| | | | |
|---|---|---|---|
| 5,162,672 A * | 11/1992 | McMahan et al. ............ 326/86 |
| 5,596,743 A | 1/1997 | Bhat et al. |
| 5,600,263 A | 2/1997 | Trimberger et al. |
| 5,629,637 A | 5/1997 | Trimberger et al. |
| 5,646,545 A | 7/1997 | Trimberger et al. |
| 5,701,441 A | 12/1997 | Trimberger |
| 5,761,483 A | 6/1998 | Trimberger |
| 5,811,985 A | 9/1998 | Trimberger et al. |
| 5,944,813 A | 8/1999 | Trimberger |
| 6,239,612 B1 * | 5/2001 | Shiflet ........................... 326/39 |
| 6,344,758 B1 | 2/2002 | Turner et al. |
| 6,472,903 B1 * | 10/2002 | Veenstra et al. ............... 326/38 |
| 6,750,675 B2 | 6/2004 | Venkata et al. |
| 6,870,397 B1 | 3/2005 | Fox et al. |

* cited by examiner

*Primary Examiner* — Daniel D Chang
(74) *Attorney, Agent, or Firm* — Adeli & Tollen LLP

(57) ABSTRACT

Some embodiments of the invention provide an integrated circuit (IC) with configurable input/output (I/O) circuits for optimally operating with two or more interfaces. Some embodiments optimally operate over the two or more interfaces by supporting a particular voltage for each interface. Also, some embodiments optimally operate over two or more interfaces by supporting a particular frequency for each supported voltage whereby supporting a particular frequency involves producing sufficient current drive at each voltage to support the particular frequency.

27 Claims, 12 Drawing Sheets

CONFIGURABLE HIGH SPEED HIGH VOLTAGE INPUT/OUTPUT CIRCUIT FOR AN IC

CLAIM OF BENEFIT TO PRIOR APPLICATIONS

This application claims the benefit of U.S. Provisional Application 60/970,518, entitled "Configurable High Speed High Voltage Input/Output Circuit for an IC," filed Sep. 6, 2007. The content of Provisional Application 60/970,518 is hereby incorporated by reference.

FIELD OF THE INVENTION

The present invention is directed towards integrated circuits with sets of configurable circuits. Specifically, the configurable input and output circuits of such integrated circuits.

BACKGROUND OF THE INVENTION

The use of integrated circuits (ICs) with configurable circuits has dramatically increased in recent years. One example of an IC with configurable circuits is a field programmable gate array (FPGA). An FPGA is a field programmable IC that often has configurable logic circuits, configurable interconnect circuits, and non-configurable input/output (I/O) circuits. The logic circuits (also called logic blocks) are typically arranged as an internal array of circuits. These logic circuits are typically connected together through numerous interconnect circuits (also called interconnects). The logic and interconnect circuits are often surrounded by the I/O circuits which provide the interface between the internal FPGA components and components that exist outside the FPGA.

The configurable logic and configurable interconnect circuits of the FPGA are typically configured according to a user design. The user design specifies the operations to be performed by the one or more configurable logic circuits and the various interconnections needed to route the data to and from such circuits in a manner that performs the user design. However, a common limiting factor in the functionality of FPGAs and other ICs with configurable circuits are that the I/O circuits are not configurable. Rather, the I/O circuits are static in the sense that they optimally operate with a particular external interface specifying a specific operating voltage and operating frequency.

The peripheral component interconnect (PCI) standard specifies one such external interface. In a particular revision, the PCI interface specifies an operating voltage of 3.3V and an operating frequency of 133 MHz. Therefore, a configurable IC comprised of only non-configurable I/O circuits that optimally operate with the 3.3V PCI interface are limited to operating with interfaces that specify the same operational parameters as the PCI interface (i.e., 3.3V, 133 MHz), regardless of the virtually unlimited number of possible internal logic and interconnect configurations.

The use of the configurable IC, specifically the I/O circuits of the configurable IC, with any interface other than the interface for which the I/O circuits were designed to operate could cause physical or electrical damage to the I/O circuits or other components of the IC. For example, use of 3.3V interface specific I/O circuits with a 5V interface could cause oxide breakdown within the transistors/gates of the 3.3V I/O circuits and thereby cause physical damage to the gates/transistors. As a result, the non-configurable I/O circuits of an IC become a constraining factor to the broader applicability of the IC as the IC is constrained to operating with a single interface.

FIG. 1 presents a typical p-channel transistor (i.e., PMOS transistor) used in implementing part of an I/O circuit. The transistor of FIG. 1 includes a substrate region 110 composed of n-type semiconductor material which separates the source and drain regions 120 each doped with oppositely charged p-type semiconductor material. The transistor also includes a gate formed over a layer of silicon dioxide 140 that bridges the source and drain regions. By applying a charge to the gate 140, such as a positive voltage at the gate 140, negative charges are drawn up from the substrate 110 into the channel 130 and positive charges are forced away from the channel 130 as shown in FIG. 2.

As the charge on the gate 210 increases, more negative charges are attracted into the channel 130. The negative charges become distributed throughout the channel 130 to create an inversion layer through which a current may pass from the source and the drain 120. The current passing through the inversion layer increases as a voltage threshold ($V_{TH}$) measuring the minimum voltage required to distribute the charges along the channel 130 is exceeded. Initially, the current across the channel 130 increases linearly until the transistor reaches a saturation state.

The linear increase of the current is determined through the following equation:

$$I_{DL} = \mu_n * C_{ox} * (W/L) * ((V_{GS} - V_{TH}) * V_{DS} - (V^2_{DS}/2)) \tag{1}$$

where $I_D$ equates to the current from source to drain, $\mu_n$ specifies the mobility of the charge carriers in the channel, $C_{ox}$ specifies the thickness of the gate oxide, W specifies the gate width, L specifies the gate length, $V_{GS}$ specifies the gate to source voltage, $V_{TH}$ specifies the threshold voltage of the transistor, and $V_{DS}$ specifies the drain to source voltage.

Saturation occurs when $V_{GS}$ exceeds $V_{TH}$ and $V_{DS}$ exceeds $V_{GS}$ less $V_{TH}$. If $V_{GS}$ exceeds $V_{DS}$, the current no longer increases linearly. Rather, the current passing through inversion layer is determined using the following equation:

$$I_{DS} = ((\mu_n * C_{ox})/2) * (W/L) * (V_{GS} - V_{TH})^2 \tag{2}$$

Together equations (1) and (2) assist in determining a particular transistor's usefulness in operating with a particular external interface (i.e., operating voltage and operating frequency of the external interface). The I/O circuits, specifically the transistors comprising the I/O circuits, are said to be optimally operating with an interface when the transistors support a voltage of the interface while producing sufficient current to support the operating frequency specified by the interface.

FIG. 3 illustrates an output driver 300 for an I/O circuit found in the prior art. In FIG. 3, data and tri-state signals control the operation of the output driver 300 through a pair of level-shifting gates 310 and 320. The level-shifting OR gate 310 receives the complementary value of the data signal and the non-complementary value of the tri-state signal (i.e., the complementary tri-state signal passes through an inverter to restore the tri-state signal to its non-complementary value). These signals in conjunction with the OR gate 310 control the operation of PMOS transistor 330. The level-shifting AND gate 320 receives complementary values of both the data signal and tri-state signal in order to control the operation of NMOS transistor 340. Specifically, when the complementary value of the tri-state signal is high (i.e., active) and the complementary value of the data signal is low (i.e., inactive), the PMOS transistor 330 is closed and the NMOS transistor 340 is open thus allowing a current from a power source to be driven across the output path 350 at a specified voltage of a particular external interface. When both the complementary values of the tri-state and data signals are high, then the PMOS transistor 330 is open and the NMOS transistor 340 is closed causing the output of the output driver 300 to be grounded.

For an output driver 300 interfacing with a 3.3V interface, the output driver 300 would include a set 3.3V transistors for the transistors 330 and 340. This allows the output driver 300 to withstand the specified 3.3V of the interface and to produce a sufficient current for passing data through the interface at a specified frequency of the interface.

However, as mentioned above, a shortcoming of such prior art output drivers and I/O circuits is that these circuits are unable to adequately function over different interfaces. For example, application of an IC containing lower voltage circuits to a higher voltage interface results in electrical or physical damage to the I/O circuits as the smaller channel, thinner oxide layered transistors of the lower voltage I/O circuit cannot withstand the higher voltage. Similarly, application of an IC containing higher voltage I/O circuits to a lower voltage interface results in an insufficient current needed to propagate signals at a specified speed of the lower voltage interface. This occurs primarily because the voltage threshold for the transistors of the I/O circuit is only minimally exceeded resulting in the weak output current.

By modifying some of the characteristics of these transistors, the operating range of the transistors can be expanded to operate over a larger range of voltages or frequencies albeit with compromises to other properties of the transistor. Examples using the aforementioned equations (1) and (2) and other equations will now be given to illustrate the various compromises.

A transistor can be made to withstand larger operating voltage ranges by increasing the oxide thickness and the channel length of the transistor. However, increases to the oxide thickness and the channel length have the undesired effect of decreasing the current passing through the transistor. The tradeoff resulting from increasing oxide thickness is illustrated through the $C_{ox}$ variable of equations (1) and (2). In these equations, $C_{ox}$ represents the oxide thickness of the transistor. $C_{ox}$ is defined by the following equation:

$$C_{ox} = \in *A/d \tag{3}$$

where $\in$ specifies a dielectric constant, A specifies the area, and d specifies the oxide thickness. As the oxide thickness (i.e., variable d) increases, the value of $C_{ox}$ decreases causing the current drive, $I_{DL}$ or $I_{DS}$, to similarly decrease. A similar tradeoff occurs between the channel length and the current drive. As evident in equations (1) and (2), this tradeoff is due to the inverse relationship between the current and the length of the transistor.

The decrease in current drive resulting from the increased oxide thickness and gate length can be offset through an increased gate width. Here again, a tradeoff results. In this instance, the size of the transistor increases causing the I/O circuit comprising the transistor to occupy additional surface area of the IC that could otherwise have been used to implement user logic or functionality. This also causes the parasitic capacitance to increase further resulting in a reduced operating frequency as shown below with reference to equation (9).

An example will now be given to illustrate the drop off in current that results from utilizing an I/O circuit with particular signaling parameters (e.g., operating voltage and/or operating frequency) for a particular interface in a different interface specifying a different set of signaling parameters. Equations (4) and (5) illustrate the current drop by solving the saturation equation (2) using signaling parameters of two different interfaces. First, equation (4) approximately computes the current produced when an I/O circuit comprising 3.3V transistors is applied to a 3.3V interface:

$$K*(3.3-1)^2 = K*5.29 \tag{4}$$

where K is a fixed constant representing the properties of the 3.3V transistor $((\mu_n*C_{ox})/2)*(W/L)$, 3.3 is the gate to source voltage ($V_{GS}$) and 1 is the threshold voltage ($V_{TH}$) for a 3.3V transistor.

Equation (5) approximately computes the current produced when the 3.3V transistors of the I/O circuit are applied to a 1.5V interface:

$$K*(1.5-1)^2 = K*0.25 \tag{5}$$

Comparing the two results illustrates an approximate 20 to 1 drop in resulting current (5.29/0.25=21.16) when applying the I/O circuit with higher voltage transistors to a lower voltage interface (where K is constant since the same transistors are used to determine the current for two different interfaces).

Equations (6)-(8) illustrate a similar change that occurs to the output resistance of an I/O circuit by solving the linear region equation (1) using signaling parameters of two different interfaces. Equation (6) first illustrates an equation for computing the resistance based on the correspondence between resistance and current (i.e., R=V/I) and equation (1):

$$R = 1/(K*(V_{GS}-V_{TH}-(V_{DS}/2))) \tag{6}$$

In equation (6), K is a fixed constant that represents the properties of a 3.3V transistor operating within the linear region ($\mu_n*C_{ox}*W/L$). From this equation, the changes to resistance for the given I/O circuit can be computed. Equation (7) approximately computes the resistance when an I/O circuit comprising 3.3V transistors having a 1V voltage threshold are applied to a 3.3V interface. Specifically, to compute equation (7), $V_{DS}$ is assumed to have a negligible value that does not affect the overall result:

$$R = 1/(K*(3.3-1)) = 0.435/K \tag{7}$$

Equation (8) approximately computes the resistance when the 3.3V transistors of the I/O circuit are applied to a 1.5V interface:

$$R = 1/(K*(1.5-1)) = 2/K \tag{8}$$

Comparing the two results illustrates an approximate 5 to 1 change in resistance when the same transistors for the same I/O circuit are applied to two different interfaces.

Some ICs "finger" additional I/O circuits to a particular I/O circuit, where the particular I/O circuit comprises a single I/O circuit or multiple I/O circuits already within a fingered arrangement, in order to recover some of the lost current. Fingering involves connecting several I/O circuits in parallel. FIG. 4 illustrates the fingering of the output drivers of FIG. 3. Such a parallel placement of the I/O circuits 400 provides a linear gain in the strength of the current. However, the current is recuperated at the cost of a much larger I/O circuit 400 that occupies valuable surface area of the IC that could otherwise be used to provide additional user design functionality. Additionally, fingering increases the overall capacitance for the combined circuits. The increased capacitance results in a lower obtainable operating frequency as illustrated by the inverse relationship between frequency and capacitance in equation (9):

$$F = 1/(2*\pi*X_C*C) \tag{9}$$

where F specifies the frequency, $X_C$ specifies the inductive reactance, and C specifies the capacitance. As such, fingering is a not a viable option for producing an I/O circuit that optimally operates over two distinct frequencies and two distinct voltages.

Therefore, a need exists for a configurable I/O circuit that can configurably select from and optimally operate with multiple voltages while producing sufficient current at the voltages to support multiple operating frequencies. Also, a need exists for the configurable I/O circuit to provide such functionality while avoiding the increases in circuit size resulting from extraneous fingering of I/O circuits and the loss of operating frequency due to the increased capacitance of larger (i.e., wider) I/O circuits. Accordingly, the configurable I/O circuit should configurably support higher voltage lower speed interfaces while also configurably supporting lower voltage higher speed interfaces without increasing design complexity, size, or manufacturing complexity of the IC.

SUMMARY OF THE INVENTION

Some embodiments of the invention provide an integrated circuit (IC) with configurable input/output (I/O) circuits for optimally operating with two or more interfaces. Some embodiments optimally operate over the two or more interfaces by supporting different signaling parameters for each interface. In some embodiments, the signaling parameters for each interface specify a different operating voltage for each interface. Also, in some embodiments the signaling parameters specify a different operating frequency for each supported operating voltage whereby supporting a particular frequency involves producing sufficient current drive at a particular operating voltage to support the particular frequency.

A configurable I/O circuit of some embodiments comprises a configurable output driver with a first higher voltage configurable driver and a second lower voltage configurable driver that utilize the same output line. In some embodiments, the configurable output driver further comprises a configurable isolation device that configurably shields the lower voltage driver from a higher voltage signal passing through the higher voltage driver. Some embodiments selectively enable the configurable output driver to configurably perform I/O operations via either the higher voltage or lower voltage driver by using configuration data stored in configuration data sets of the IC. Some embodiments selectively enable the isolation device using the same configuration data.

A configurable output driver passes a first signal with a first voltage to a particular output pad of the IC using the first driver and the configurable output driver passes a second signal with a second voltage to the particular output pad using the second driver of the configurable I/O circuit. In some embodiments, the configurable I/O circuit configures to pass the first signal by enabling the first driver while disabling the second driver. Moreover, disabling the second driver includes enabling the isolation device to shield the second driver from the signal passing through the first driver. In some embodiments, the configurable I/O circuit configures to pass the second signal by enabling the second driver while disabling the first driver.

BRIEF DESCRIPTION OF THE DRAWINGS

The novel features of the invention are set forth in the appended claims. However, for the purpose of explanation, several embodiments of the invention are set forth in the following figures.

DETAILED DESCRIPTION

Figure 1:
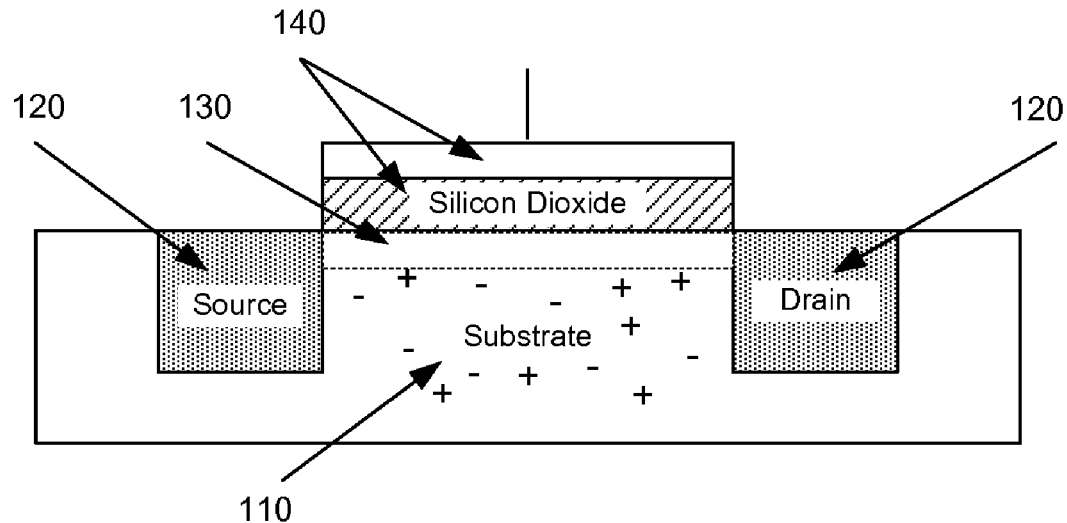
FIG. 1 presents a typical p-channel transistor.
Figure 2:
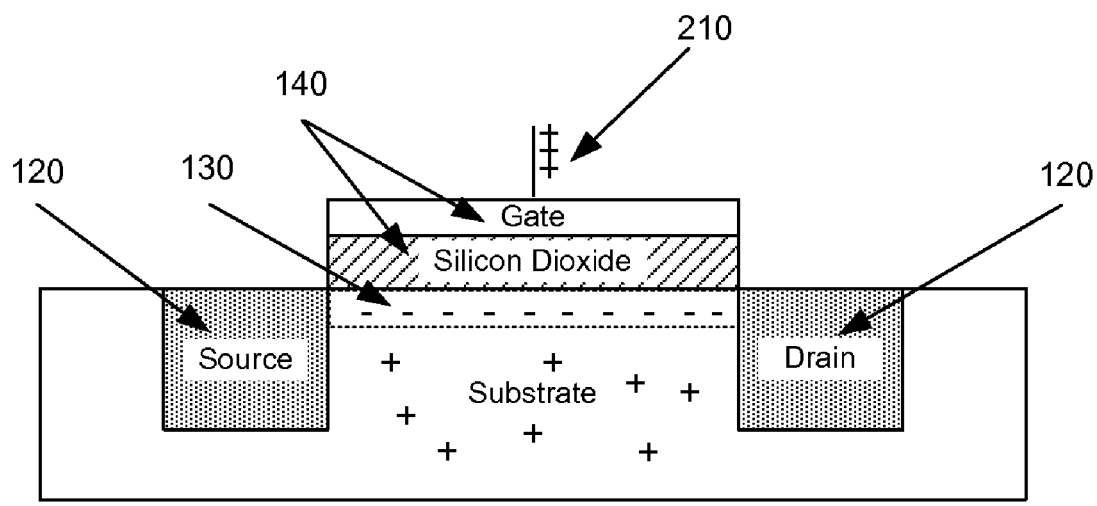
FIG. 2 illustrates the creation of an inversion layer within the transistor implementation of FIG. 1.

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

I. Overview

Some embodiments of the invention provide an integrated circuit (IC) with configurable input/output (I/O) circuits for optimally operating with two or more interfaces. Some embodiments optimally operate over the two or more interfaces by supporting different signaling parameters for each interface. In some embodiments, the signaling parameters for each interface specify a different operating voltage for each interface. Also, in some embodiments the signaling parameters specify a different operating frequency for each supported operating voltage whereby supporting a particular frequency involves producing sufficient current drive at a particular operating voltage to support the particular frequency.

A configurable I/O circuit of some embodiments comprises a configurable output driver with a first higher voltage configurable driver and a second lower voltage configurable driver that utilize the same output line. In some embodiments, the configurable output driver further comprises a configurable isolation device that configurably shields the lower voltage driver from a higher voltage signal passing through the higher voltage driver. Some embodiments selectively enable the configurable output driver to configurably perform I/O operations via either the higher voltage or lower voltage driver by using configuration data stored in configuration data sets of the IC. Some embodiments selectively enable the isolation device using the same configuration data.

A configurable output driver passes a first signal with a first voltage to a particular output pad of the IC using the first driver and the configurable output driver passes a second signal with a second voltage to the particular output pad using the second driver of the configurable I/O circuit. In some embodiments, the configurable I/O circuit configures to pass the first signal by enabling the first driver while disabling the second driver. Moreover, disabling the second driver includes enabling the isolation device to shield the second driver from the signal passing through the first driver. In some embodiments, the configurable I/O circuit configures to pass the second signal by enabling the second driver while disabling the first driver.

Several more detailed embodiments of the invention are described in the sections below. Section II describes an IC architecture and some of the various configurable elements within the IC architecture. Next, Section III describes the configurable input/output (I/O) circuits of the IC. Lastly, Section IV describes an electronics system that has an IC which implements some of the embodiments of the invention.

II. IC with Configurable Elements

An IC is a device that includes numerous electronic components (e.g., transistors, resistors, diodes, etc.) that are embedded typically on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

An IC of some embodiments include configurable circuits. A configurable circuit is a circuit that can "configurably" perform a set of operations. Specifically, a configurable circuit receives "configuration data" that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data that can configure the configurable circuits of the IC to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of manners. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In addition to configurable circuits, a configurable IC also typically includes non-configurable circuits (e.g., non-configurable logic circuits, interconnect circuits, memories, etc.).

Moreover, some embodiments of the invention can be implemented in an IC that has reconfigurable circuits that reconfigure (i.e., base their operation on different sets of configuration data) one or more times during the operation of the IC. Specifically, such ICs are ICs with configurable circuits that can reconfigure during runtime. A reconfigurable IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

For instance, a reconfigurable circuit of some embodiments that operates on N (e.g., four) sets of configuration data receives the N configuration data sets sequentially in an order that loops from the first configuration data set to the last configuration data set. Such a sequential reconfiguration scheme is referred to as an N "loopered" scheme. Other embodiments, however, might be implemented such that the reconfigurable circuit can conditionally loop through N configuration data sets out of M configuration data sets where M is greater than N.

Figure 5:
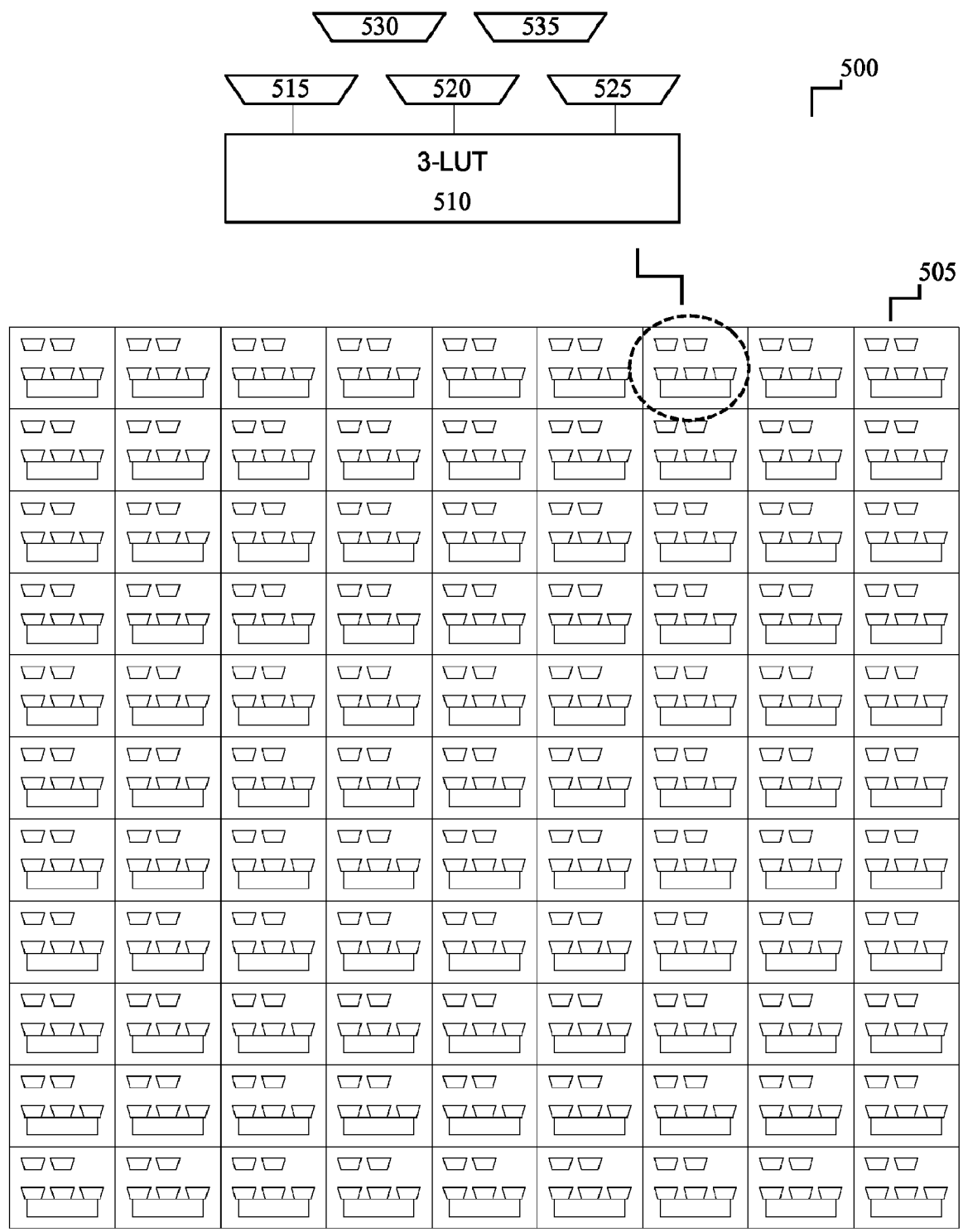
FIG. 5 illustrates a configurable circuit architecture that is formed by numerous configurable tiles that are arranged in an array with multiple rows and columns.
Figure 6:
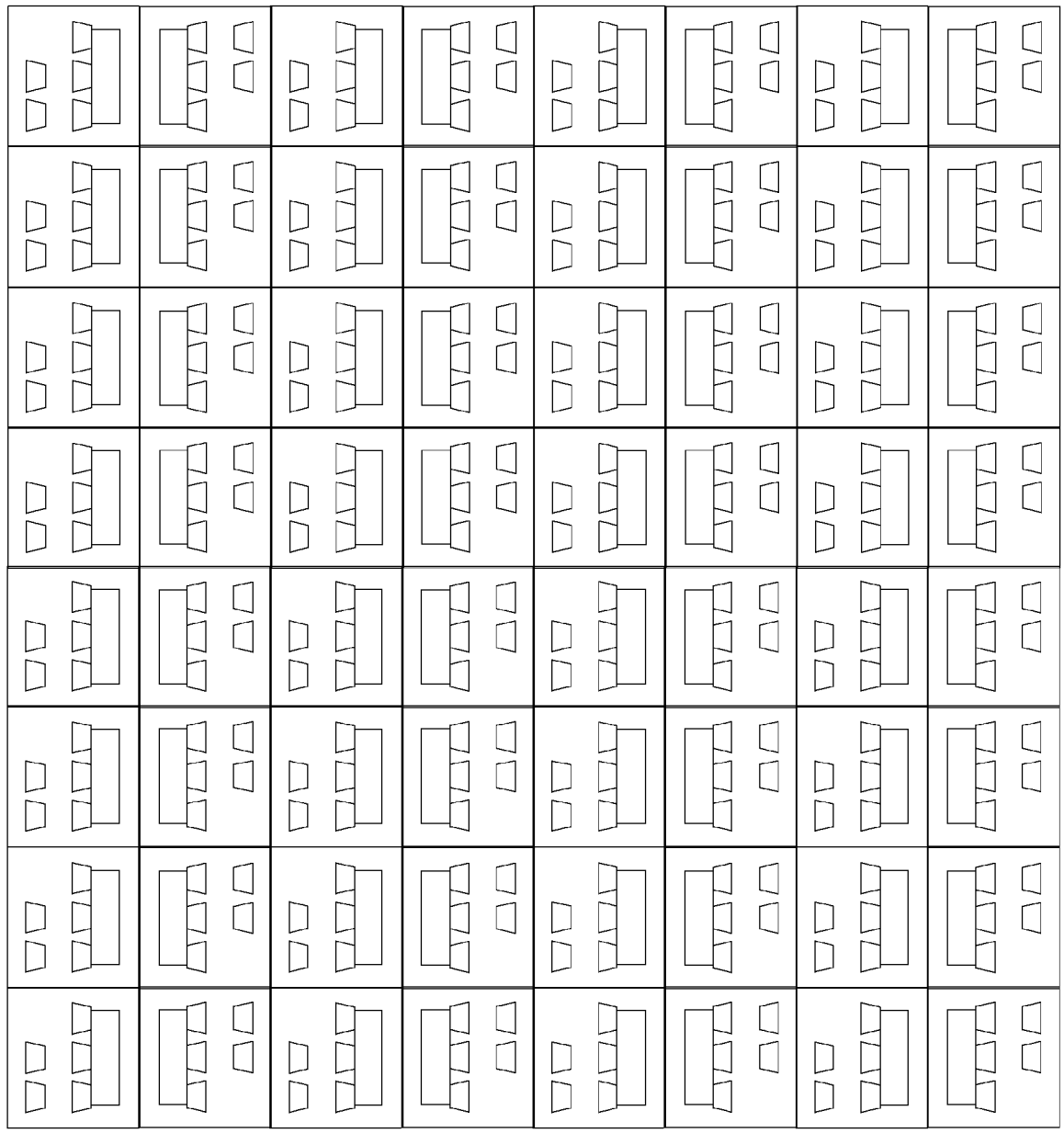
FIG. 6 provides one possible physical architecture of the IC with configurable circuits illustrated in FIG. 5.
Figure 7:
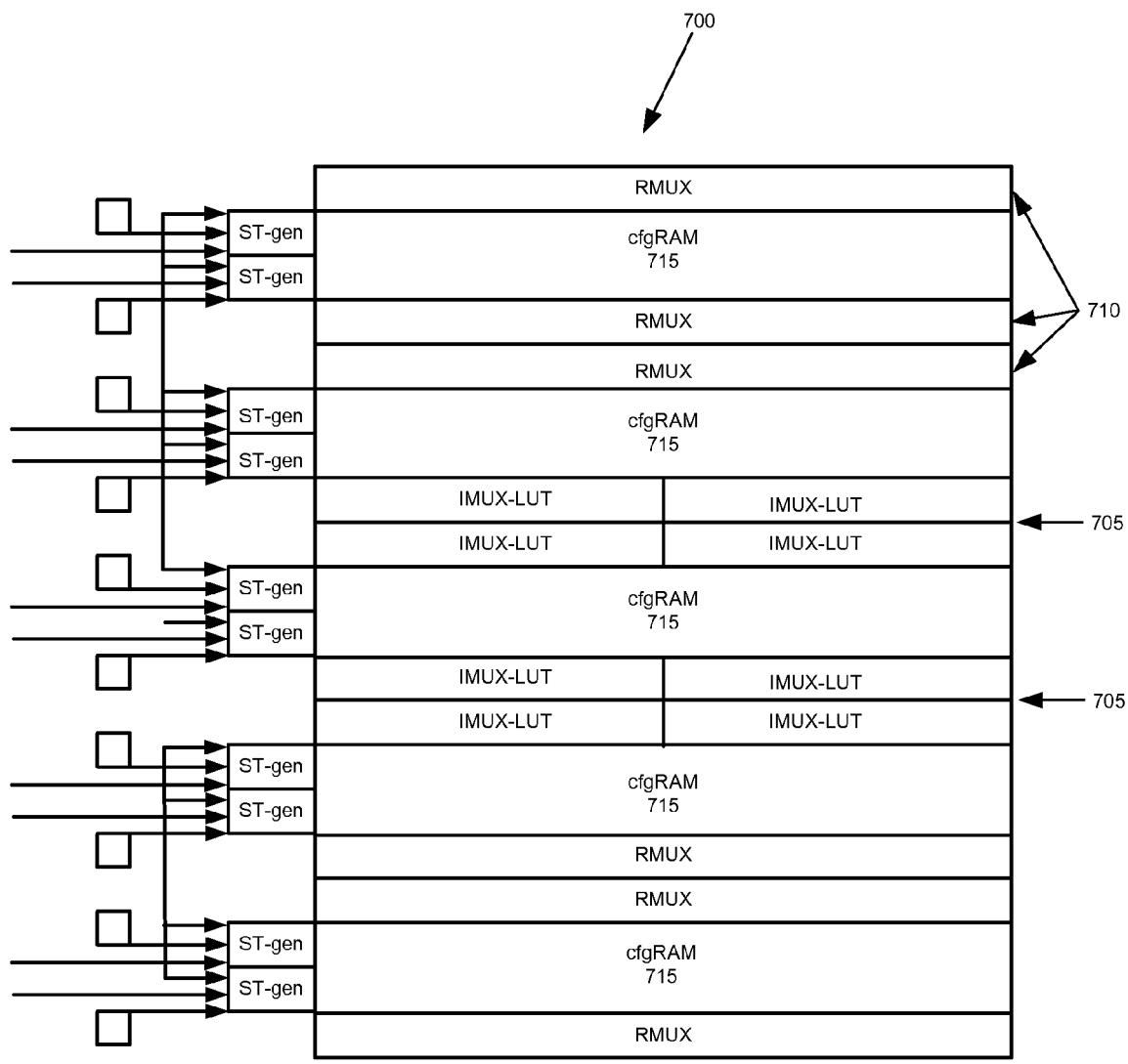
FIG. 7 illustrates the detailed tile arrangement of some embodiments.

In some embodiments, the configurable or reconfigurable circuits might be organized in an arrangement that has all the circuits organized in an array with several aligned rows and columns. In addition, within such a circuit array, some embodiments disperse other circuits (e.g., memory blocks, processors, macro blocks, IP blocks, SERDES controllers, clock management units, etc.). FIGS. 5-7 illustrate several configurable/reconfigurable circuit arrangements/architectures. One such architecture is illustrated in FIG. 5.

The architecture of FIG. 5 is formed by numerous configurable tiles 505 that are arranged in an array with multiple rows and columns. In FIG. 5, each configurable tile includes a configurable three-input LUT 510, three configurable input-select multiplexers 515, 520, and 525, and two configurable routing multiplexers 530 and 535. Different embodiments have different number of configurable interconnect circuits 530. For instance, some embodiments may have eight configurable interconnect circuits while others may have more or less such circuits. For each configurable circuit, the configurable IC 500 includes a set of storage elements (e.g., a set of SRAM cells) for storing a set of configuration data.

In some embodiments, the logic circuits are look-up tables (LUTs) while the interconnect circuits are multiplexers. Also, in some embodiments, the LUTs and the multiplexers are sub-cycle reconfigurable circuits. In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits.

In some embodiments, the examples illustrated in FIG. 5 represent the actual physical architecture of a configurable IC. However, in other embodiments, the examples illustrated in FIG. 5 topologically illustrate the architecture of a configurable IC (i.e., they conceptually show the configurable IC without specifying a particular geometric layout for the position of the circuits).

In some embodiments, the position and orientation of the circuits in the actual physical architecture of a configurable IC are different from the position and orientation of the circuits in the topological architecture of the configurable IC. Accordingly, in these embodiments, the ICs physical architecture appears quite different from its topological architecture. For example, FIG. 6 provides one possible physical architecture of the configurable IC 500 illustrated in FIG. 5.

Having the aligned tile layout with the same circuit elements of FIG. 6 simplifies the process for designing and fabricating the IC, as it allows the same circuit designs and mask patterns to be repetitively used to design and fabricate the IC. In some embodiments, the similar aligned tile layout not only has the same circuit elements but also have the same exact internal wiring between their circuit elements. Having such layout further simplifies the design and fabrication processes as it further simplifies the design and mask making processes.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

Some embodiments might utilize alternative tile structures. For instance, FIG. 7 illustrates an alternative tile structure that is used in some embodiments. This tile 700 has two sets 705 of 4-aligned LUTs along with their associated IMUXs. It also includes six sets 710 of RMUXs and five banks 715 of configuration RAM storage. Each 4-aligned LUT tile shares one carry chain. One example of which is described in U.S. application Ser. No. 11/082,193 entitled "Configurable IC with Routing Circuits with Offset Connections", filed on Mar. 15, 2005, now issued as U.S. Pat. No. 7,295,037. One of ordinary skill in the art would appreciate that other organizations of LUT tiles may also be used in conjunction with the invention and that these organizations might have fewer or additional tiles.

III. Configurable High Speed High Voltage I/O Circuits

In some embodiments, sets of configurable input/output (I/O) circuits provide the communication pathway between the IC core (e.g., logic circuits, interconnect circuits, and various other internal components of the IC) and the external components outside the IC with which the IC communicates. In some embodiments, the communication pathway is created by the input and output drivers of the I/O circuits that are built into the IC chip and sets of I/O pins through which the IC receives input and provides output to the external components. In creating the communication pathway, some embodiments place the sets of configurable I/O circuits between the IC core and the set of I/O pins.

Figure 8:
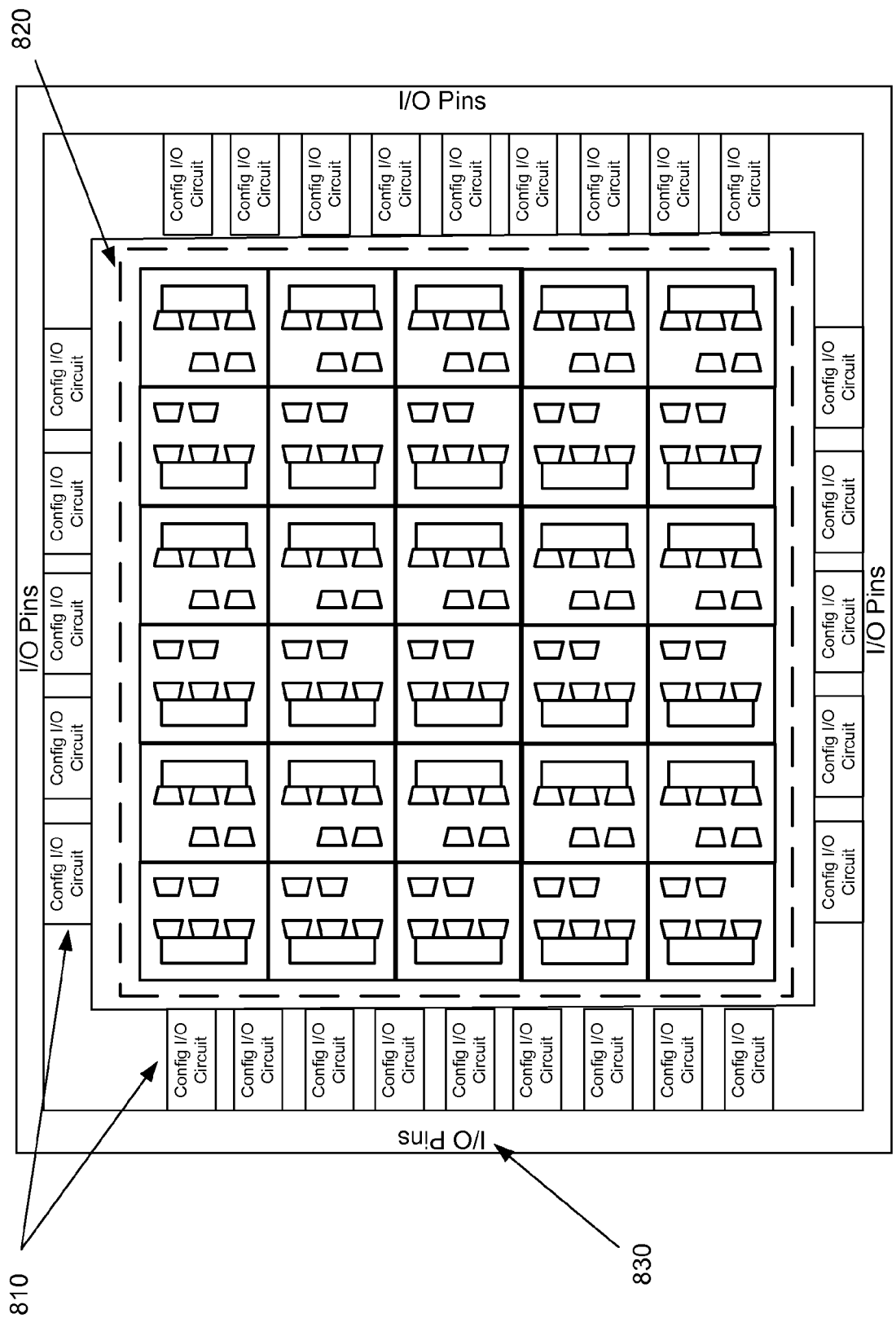
FIG. 8 illustrates sets of configurable I/O circuits located between an IC core and I/O pins.

The architecture of FIG. 8 illustrates sets of configurable I/O circuits 810 located between the IC core 820 and I/O pins 830. In FIG. 8, one or more I/O pins 830 may be connected to one or more configurable I/O circuits 810. Moreover, the connections between the I/O pins 830 and the configurable I/O circuits 810 are configurable connections in some embodiments. Accordingly, the assignment of I/O pins 830 to I/O circuits 810 is determined based on configuration data. Therefore, for a first configuration, an I/O pin is configurably connected to a first configurable I/O circuit. For a second configuration, the same I/O pin may be configurably connected to a second different configurable I/O circuit. Also, the configurability of the I/O circuits allows for an I/O pin to be configurably connected to two or more different I/O circuits connected in parallel. In this manner, the configurable I/O circuits 810 are "fingered" together to extend the functionality afforded by a single I/O circuit.

Though the configurable I/O circuits 820 are shown in FIG. 8 to surround the IC core 820, it should be apparent to one of ordinary skill in the art that the configurable I/O circuits 810 of some embodiments are disbursed throughout various regions of the IC. Therefore, in some embodiments, the configurable I/O circuits 810 appear intermittently throughout the IC. Additionally, in some embodiments the configurable I/O circuits 810 are not directly connected to the I/O pins 830 of the IC. Instead, some embodiments provide the inputs and outputs of the configurable I/O circuits 810 to a set of I/O pads (not shown) which in some embodiments contain other circuits or devices such as resistors or capacitors that receive the I/O signals prior to reaching the I/O pins.

In some embodiments, the configurable I/O circuits include input drivers for receiving inputs from an external interface to supply to the internal core logic of the IC. In some embodiments, the configurable I/O circuits also include output drivers for supplying outputs from the IC to the external interface. Each of the input and output drivers include at least two configurable drivers (e.g., such as those depicted in FIG. 3). Each of the at least two configurable drivers optimally operates over a particular voltage to produce sufficient current for supporting a particular operating frequency. As such, the configurable I/O circuits of some embodiments are able to interface with distinct external interfaces where each external interface operates with a different operating voltage and/or operating frequency.

In some embodiments, the input and output drivers have their operation at least partially controlled by configuration data stored in configuration data storage of the IC. The configuration data determines a first configurable driver to enable to perform level-shifting on a first voltage coming into and exiting the IC. By modifying the configuration data, a second configurable driver is enabled to perform the level-shifting on a second voltage coming into and exiting the IC. In this manner, the configuration data selects drivers that operate within their optimal range of voltage and frequency when interfacing with a particular interface. As such, the enabled drivers, specifically the transistors comprising the drivers, are able to withstand the operating voltage of a particular external interface while also producing a sufficient current at the operating voltage to support a frequency specified for the particular external interface.

For example, when an IC core operates at 1V and interfaces with a 3.3V, 133 MHz external interface and a 1.5V, 400 MHz external interface, the configurable I/O circuits of the IC selectively configure to convert the 3.3V signals coming in from the 3.3V interface into the core specified voltage (e.g., the 1V internal core voltage) and convert the internal 1V signals to 3.3V when outputting to the 3.3V external interface. Also, when outputting to the 3.3V external interface, the drivers produce sufficient current so that the output passes at the specified 133 MHz frequency. The configurable I/O circuits of the IC can also selectively configure to convert the 1.5V signals coming in from the 1.5V external interface into the core specified voltage (e.g., the 1V internal core voltage) and convert the internal 1V signals to 1.5V when outputting to the 1.5V external interface. Similarly, the I/O circuits produce sufficient current at the 1.5V operating voltage to pass outputs at the 400 MHz frequency.

Figure 9:
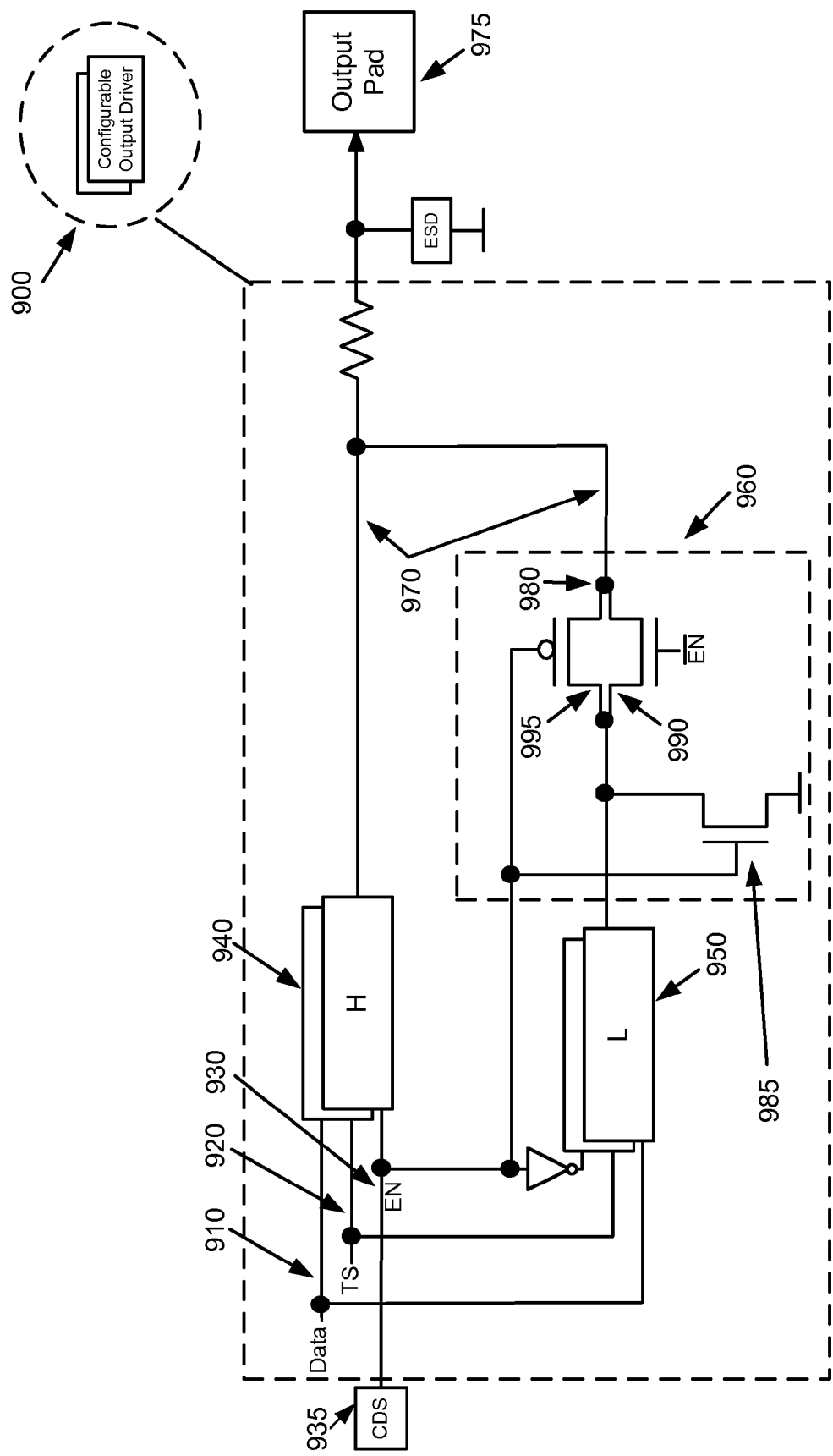
FIG. 9 presents a configurable high speed high voltage output driver in accordance with some embodiments of the invention.

FIG. 9 presents a configurable output driver 900 for a configurable I/O circuit in accordance with some embodiments of the invention. The configurable output driver 900 includes a data signal 910, a tri-state control signal 920, an enable signal 930, a higher voltage driver 940, a lower voltage driver 950, an isolation circuit 960, and a shared output line 970 that connects to an output pad 975.

Figure 3:
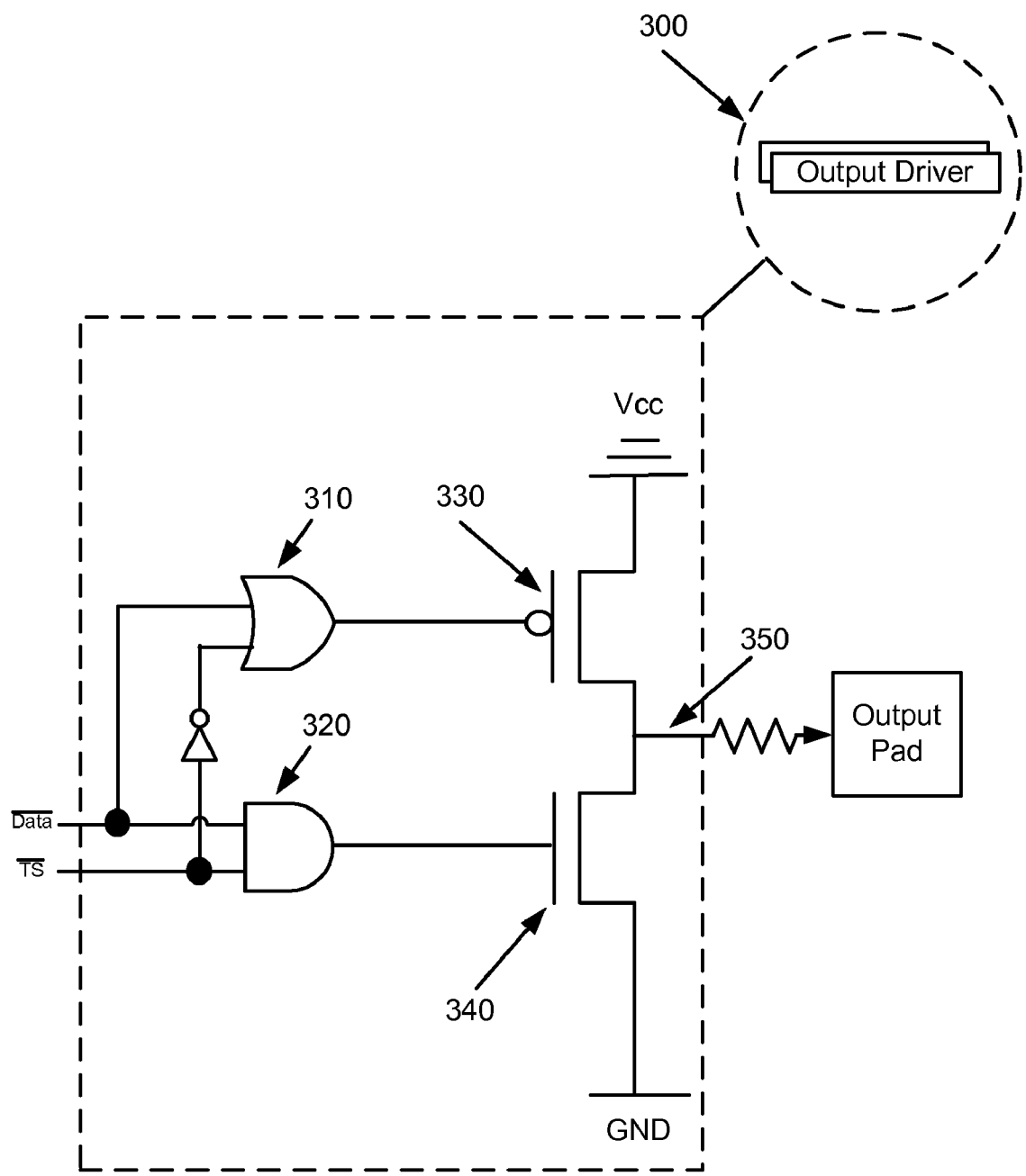
FIG. 3 illustrates an output driver of an I/O circuit found in the prior art.
Figure 4:
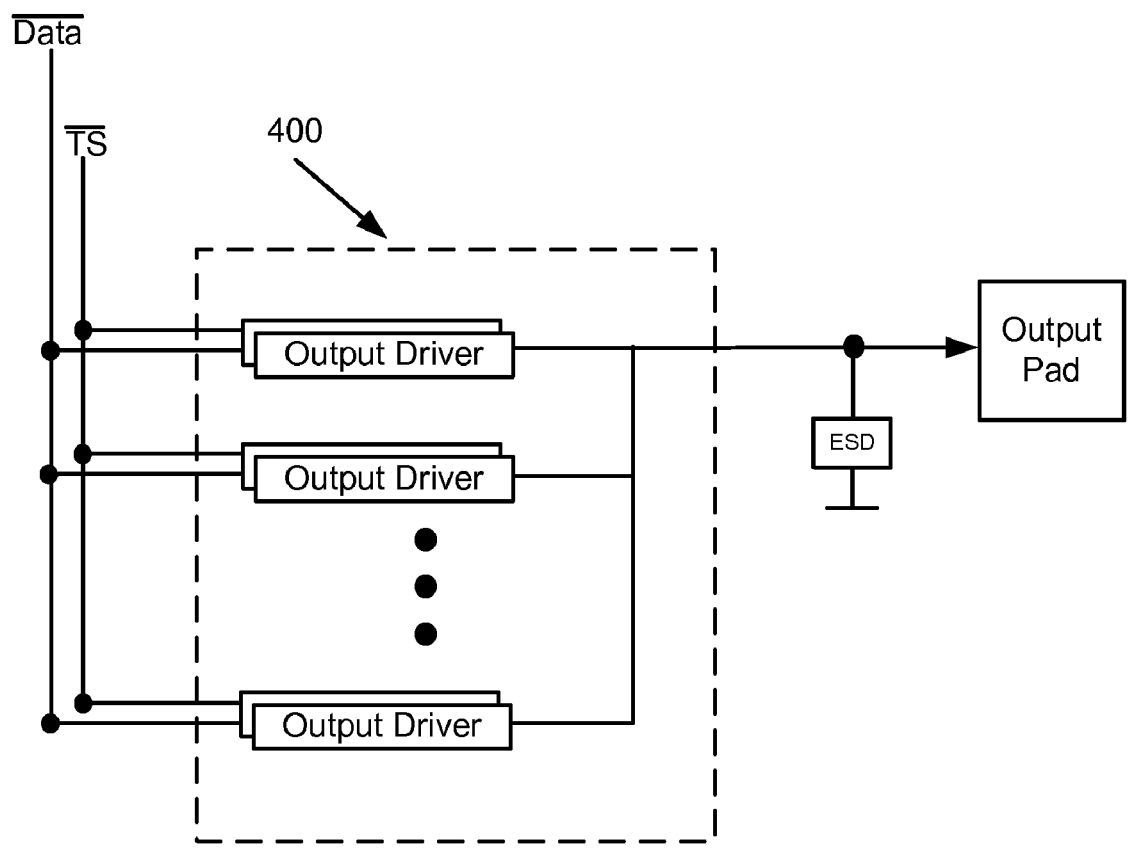
FIG. 4 illustrates the fingering of the FIG. 3 output drivers.

In some embodiments, both the higher voltage driver 940 and the lower voltage driver 950 comprise the circuit depicted in FIG. 3 with transistors 330 and 340. However, the transistors for the higher voltage driver 940 are able to withstand higher voltages than the transistors found within the lower voltage driver 950. In some embodiments, the higher voltage transistors support interfaces such as the 3.3V PCI interface and the lower voltage transistors support lower voltage but higher speed interfaces such as the 1.8V DDR2 or 1.5V DDR3 memory interface standards. It should be apparent to one of ordinary skill in the art that the higher voltage driver 940 and the lower voltage driver 950 may optimally operate over any combination of voltages and frequencies and are not limited to the 3.3V PCI, 1.8V DDR2, or 1.5V DDR3 interfaces.

The enable signal 930 determines which driver 940 or 950 will be used in outputting the data signal 910 across the output line 970 to the output pad 975. In some embodiments, the enable signal 930 is pre-determined by user-design configuration data that is stored within a configuration data set 935 of the IC. Therefore, during the configuration of the IC, the configuration data is retrieved from the configuration data sets and supplied to the output driver 900 to configure the circuits of FIG. 9.

An active (i.e., high) enable signal causes the higher voltage driver 940 to receive and convert the data signal 910 to the voltage of a first external interface. An inactive (i.e., low) enable signal disables the higher voltage driver 940 and instead causes the lower voltage driver 950 to receive and convert the data signal 910 to the voltage of a second lower voltage external interface. Therefore, if a user design specifies operational parameters for a 3.3V (i.e., the higher voltage) interface, then the configurable output driver of FIG. 9 will read the configuration data and configure the circuits accordingly. Thus the enable line 930 will cause the higher voltage driver 940 to become active. The active higher voltage driver 940 receives the data signal 910 at the internal voltage of the IC (i.e., 1V) and converts the data signal 910 to the specified 3.3V before passing the converted signal across the output lines 970 to the output pad 975.

Similarly, if the user design specifies interfacing with a 1.5V interface, then the enable line 930 will be inactive causing the lower voltage driver 950 to become active. The active lower voltage driver 950 receives the data signal 910 at the internal voltage of the IC (i.e., 1V) and converts the data signal 910 to the specified 1.5V before passing the converted signal across the output lines 970 to the output pad 975.

Since the higher voltage driver 940 and the lower voltage driver 950 of FIG. 9 share the same output line 970 when passing data to the output pad 975, the output driver 900 of FIG. 9 includes a configurable isolation device 960 to shield the lower voltage drivers 950 from higher voltage signals passing through the higher voltage driver 940 when the higher voltage driver 940 is enabled. Without the isolation device 960, the higher voltage signal from the higher voltage driver 940 would propagate through the output line 970 to the lower voltage driver 950. In many instances this would cause electrical or physical damage to the circuits of the lower voltage driver 950.

Inclusion of the isolation device 960 permits both lower voltage and higher voltage signals to propagate through the same output driver 900 along the same set of output lines to the output pad 975. As discussed above, the enable signal 930 selectively controls the proper set of drivers for connecting the data signal 910 to the output pad 975. The same enable signal 930 may also be used to control the isolation device 960 as will be described in further detail below.

In some embodiments, the isolation device 960 is formed by: (1) an NMOS transistor 990, (2) a PMOS transistor 995, and (3) a leakage regulating transistor 985. In some embodiments, the NMOS transistor 990 and PMOS transistor 995 are together referred to as a transfer gate 980. The enable signal 930 controlling the set of drivers 940 and 950 also controls the transfer gate 980 and the leakage regulating transistor 985. Therefore, when the enable signal 930 enables the higher voltage driver 940 and permits the higher voltage driver 940 to pass a higher voltage signal through to the output lines 970, the same enable signal 930 similarly activates the isolation device 960. The active isolation device 960 shields the lower voltage driver 950 from the higher voltage signals passing through the output lines 970 to the output pad 975.

When the isolation device 960 is active, the transfer gate 980 is open thus preventing the signal from one side of the transfer gate 980 from propagating to the other side. Nevertheless, some of the higher voltage signal may still leak through the transfer gate 980 and potentially damage the lower voltage drivers 950. Therefore, in some embodiments, the leakage regulating transistor 985 is located between the lower voltage driver 950 and the transfer gate 980. The leakage regulating transistor 985 is similarly activated by the same enable signal 930 that enables the higher voltage driver 940 and opens the transfer gate 980. Activation of the leakage regulating transistor 985 causes any signal or current passing between the transfer gate 980 and the lower voltage driver 950 to drain to ground. While the isolation device 960 has been described to include a set of transistors comprising a transfer gate 980 and a leakage regulating transistor 985, one of ordinary skill in the art will recognize that such a circuit 960 can be embodied using several different circuit implementations.

In some embodiments, the output driver 900 of FIG. 9 further includes a resistor within the output driver 900 to improve the linearity of the output resistance of the driver, though in some embodiments the resistor is located apart from the output driver 900. Additionally, an electrostatic discharge (ESD) is included in some embodiments to absorb discharge that may occur outside the IC and enter through the output pad 975.

The configurable output driver of FIG. 9 and a corresponding configurable input driver thus define a configurable I/O circuit of some embodiments that optimally performs I/O functions over two different interfaces. Moreover, such dual functionality is provided through a circuit structure that occupies a minimal amount of surface area on an IC. Such size savings result from each of the devices comprising the I/O drivers operating at an optimum voltage to produce sufficient current to operate at a particular frequency.

The functionality of the I/O circuits of some embodiments, specifically the output drivers of FIG. 9, may be expanded to support additional voltages and frequencies. To provide such functionality, some embodiments of the I/O circuits are modified to include at least three different drivers to facilitate operations over three different voltage ranges. In some such embodiments, the I/O circuit includes two isolation devices to shield each of the lower voltage drivers from the higher voltage signals passing through the higher voltage drivers. The configurable I/O circuit configurably selects between one of the three supported voltages and enables one output driver and possibly one or more isolation devices. For instance, the output drivers of some embodiments include higher voltage (e.g., 5V) transistors, intermediate voltage (e.g., 3.3V) transistors, and lower voltage (e.g., 1.5V) transistors for interfacing with corresponding interfaces. If the output driver is configured to output at the higher voltage, then a higher voltage signal passing through the higher voltage transistors needs to be isolated from the intermediate voltage transistors and lower voltage transistors. As such, a first isolation device for the intermediate voltage transistors is enabled and a second isolation device for the lower voltage transistors is enabled to shield these circuits from the higher voltage traveling across the shared output line.

When the output driver is configured to output at the intermediate voltage, then the intermediate signal passing through the intermediate voltage transistors needs only to be shielded from the lower voltage transistors. As such, only the second isolation device is enabled. The higher voltage transistors need not include an isolation device as they are able to withstand both the intermediate and lower voltage signals without suffering physical or electrical damage.

Additionally, to support such three tiered output drivers, some embodiments include at least one additional enable signal to control the additional configurable drivers and the additional isolation device. One of ordinary skill in the art will recognize that the inclusion of additional output drivers (e.g., more than three drivers with corresponding enable signals) and isolation devices can cause the I/O circuit of FIG. 9 to optimally support any number of voltage ranges.

Figure 10:
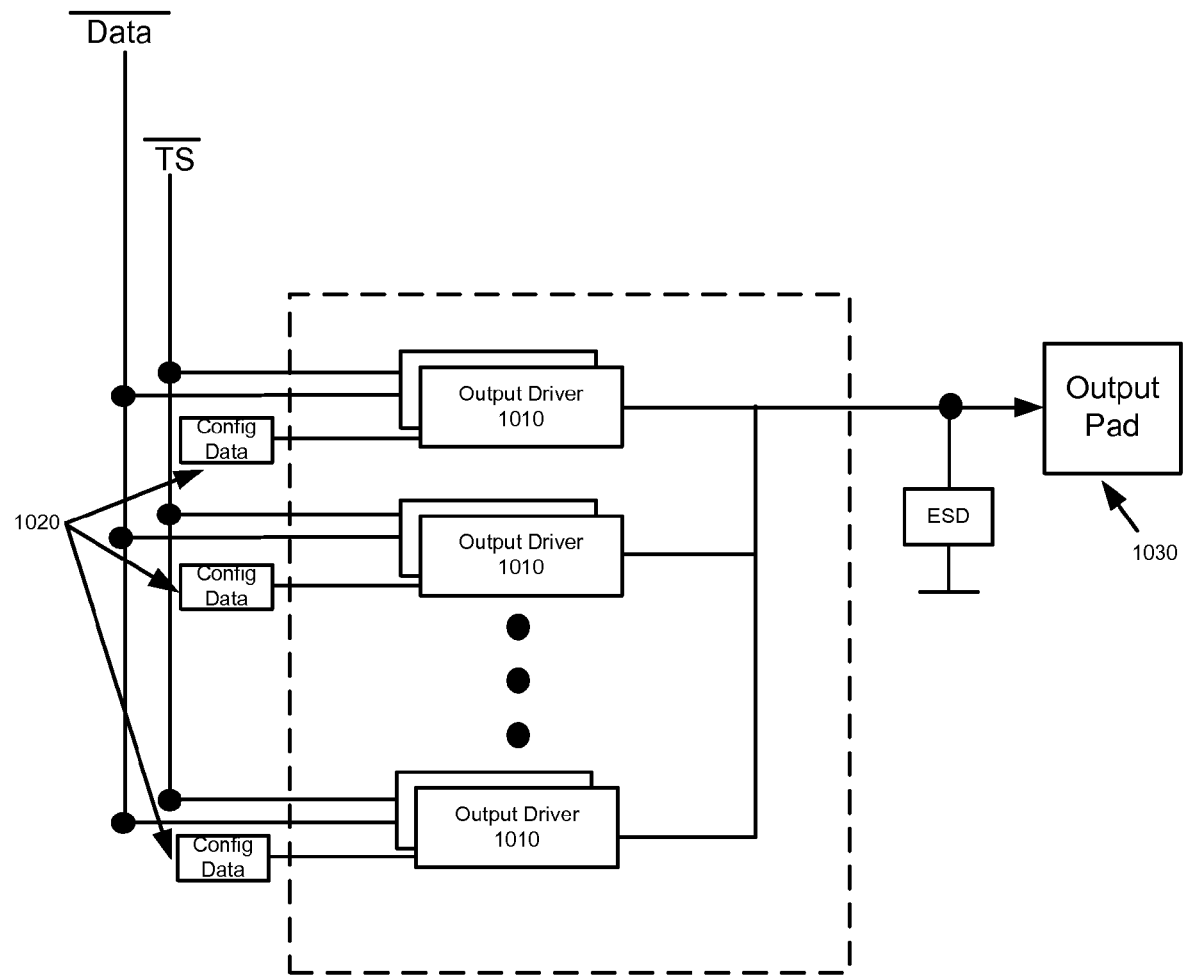
FIG. 10 illustrates the fingering of the configurable output drivers of FIG. 9 in accordance with some embodiments of the invention.

Some embodiments further permit two or more I/O circuits to be connected in parallel. The parallel configuration of I/O circuits allows the I/O circuits to operate over a larger range of interfaces. As described above, placing the I/O circuits in parallel increases the current produced by each I/O circuit individually. As a result, a parallel configuration of I/O circuits can operate with a broader range of interfaces. FIG. 10 illustrates the output drivers of FIG. 9 operating in parallel. In FIG. 10, each output driver circuit 1010 receives separate configuration data 1020. In this manner, individual output driver circuits 1010 are enabled or disabled depending on the user design configuration. It should be apparent to one of ordinary skill in the art that the parallel operation of output drivers may be used to provide a stabilized or calibrated signal at the output pad 1030.

The parallel configuration of I/O circuits, is also useful for generating a differential signal where a first I/O circuit in the parallel configuration produces a true signal and a second I/O circuit of the parallel configuration produces the compliment of the true signal. The differential signals can then be used to effectively double the edge rate for the output thus facilitating higher frequencies.

While the description with reference to FIG. 9 has focused on the output driver of the configurable I/O circuits, it should be apparent to one of ordinary skill in the art that in some embodiments the input drivers of the configurable I/O circuits similarly contain at least two sets of driver circuits to support at least two distinct interfaces. In some such input drivers, the input drivers are configured via configuration data sets to enable either a higher voltage or lower voltage input driver. If the higher voltage input driver is enabled, the IC is configured to a receive signals from components external to the IC over a higher voltage interface. Accordingly, the higher voltage input driver receives the external signals and converts the signals to the internal operating voltage of the IC. For instance, for an IC that interfaces with a 3.3V interface and internally operates at 1V, the input drivers will receive external signals at the specified 3.3V and will convert the signals to the internal 1V before passing the signals to the core components of the IC.

The configurability of I/O circuits allows for IC designs designed for one external interface to easily port over to a different external interface. This allows designers the ability to quickly adapt and tune an existing IC design across a wide variety of interfaces. Such functionality is further useful in the commercial realm as chip designers can future proof their products using the configurable I/O circuits provided by some embodiments. For instance, a product developer can create a product for a first interface. The product developer is able to future proof the product through a simple firmware upgrade that allows the same product to work in conjunction with a second different interface where the second interface may contain the same physical interface (i.e., number of pins) but specify a lower voltage and higher operating frequency. Therefore, the customer need not buy a new version of the product, but can adapt the existing product to work with the modified interface.

Moreover, the functionality provided by the configurable I/O circuits of some embodiments permits an IC designer to test a design over a set of interfaces using the same configurable IC. The designer need not waste additional resources in buying separate configurable chips for each interface, but can reuse the same configurable IC with the same configurable elements on each desired interface. Such a configurable IC further reduces development time as only the configurable I/O circuits of the chip need to be reconfigured for the different interface. Previously, developers had to purchase a configurable IC for each interface they wished to support. The developers then had to separately configure the ICs even though the internal logic of the chips was the same or similar. The only difference was that one chip contained I/O circuits designed to operate with one interface and the other chip contained I/O circuits designed to operate with a different interface.

Figure 11:
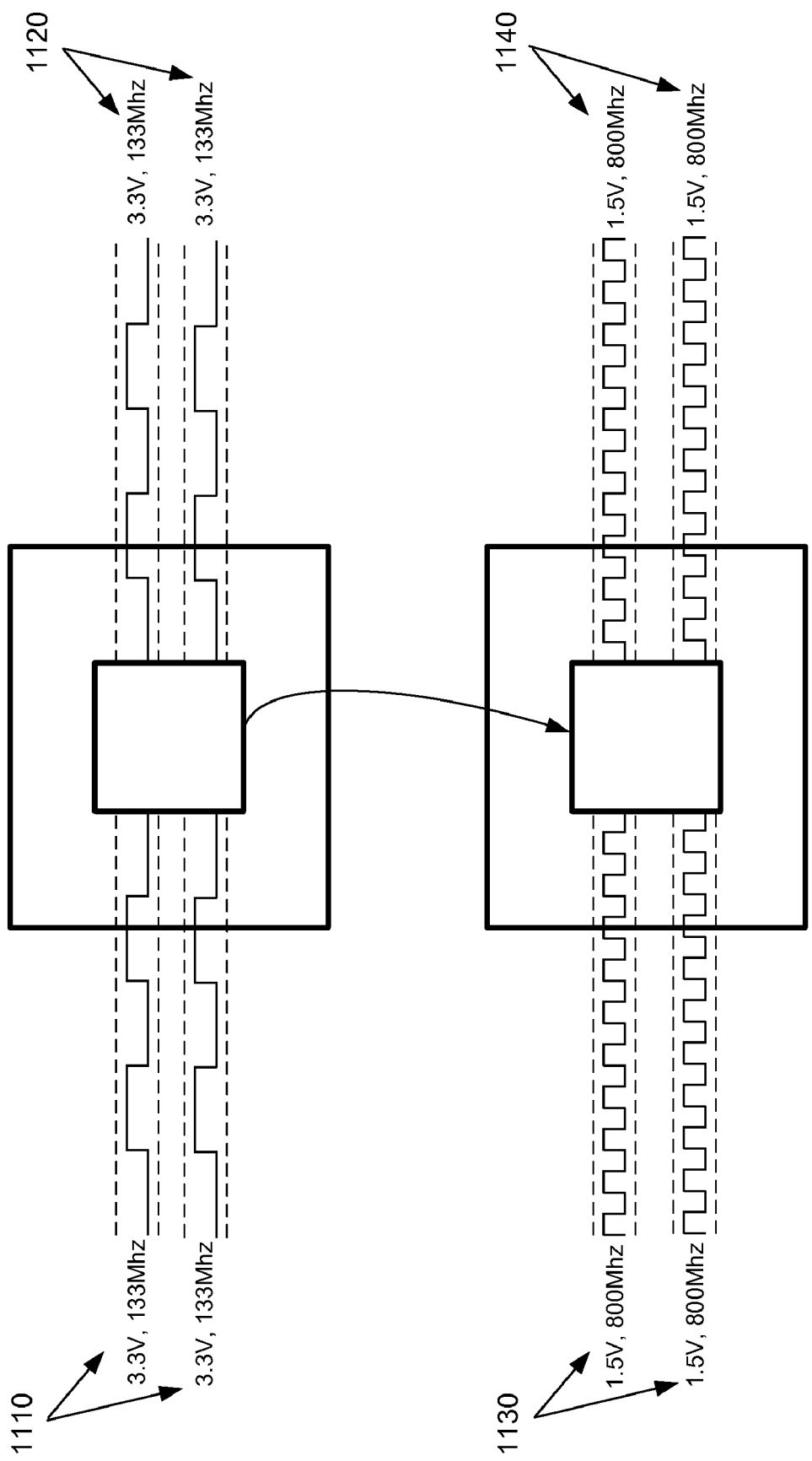
FIG. 11 illustrates how the configurable high speed high voltage I/O circuits of some embodiments can be configured to provide any combination of output interfaces as specified by an IC design.

FIG. 11 illustrates an IC with configurable I/O circuits where the configurable I/O circuits of the IC are configurable to support two separate interfaces. For instance, a set of input pins 1110 and a set of output pins 1120 of the IC are configured to operate over a 3.3V interface with a frequency of 133 MHz during a first configuration of the IC. The same IC is then configured to have the set of input pins 1130 and the set of output pins 1140 operate over a lower voltage 1.5V interface with a frequency of 800 MHz during a second configuration of the IC.

IV. IC with Configurable Elements and System

Some embodiments described above are implemented in configurable ICs that can compute configurable combinational digital logic functions on signals that are presented on the inputs of the configurable ICs. In some embodiments, such computations are state-less computations (i.e., do not depend on a previous state of a value). Some embodiments described above are implemented in configurable ICs that can perform a continuous function. In these embodiments, the configurable IC can receive a continuous function at its input, and in response, provide a continuous output at one of its outputs.

Figure 12:
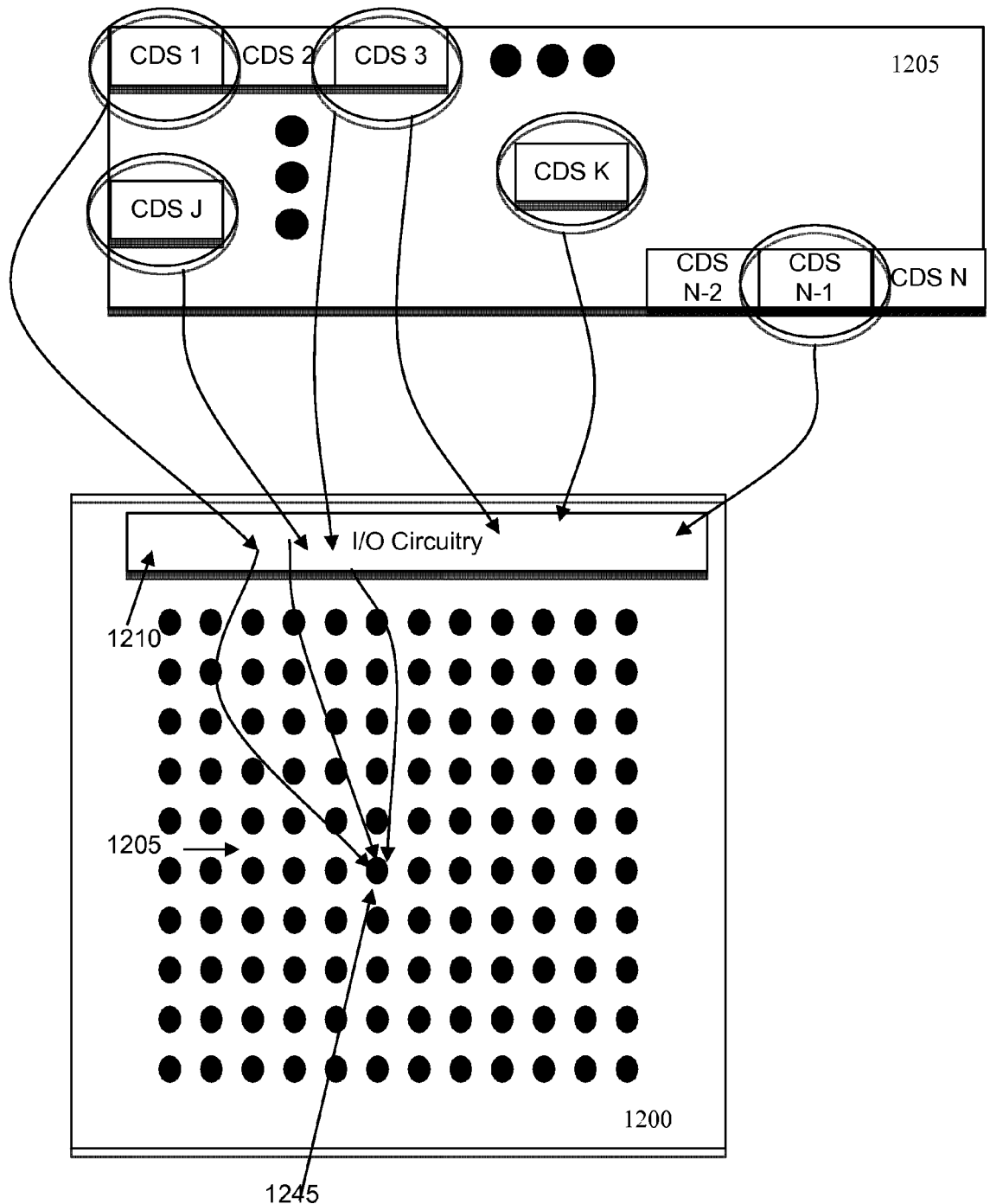
FIG. 12 illustrates an example of data between an I/O circuitry and configurable nodes that includes configuration data that configure the I/O circuitry and nodes to perform particular operations.

FIG. 12 illustrates configurable input/output (I/O) circuits of a configurable IC of some embodiments that receive a configuration data pool 1205 for the configurable IC. This pool includes N configuration data sets (CDS). The data includes in some embodiments configuration data that configures the internal nodes of the configurable IC to perform particular operations. Additionally, the data includes in some embodiments configuration data that configures the I/O circuits to select between alternative drivers for interfacing with different external interfaces.

This data pool includes N configuration data sets (CDS). As shown in FIG. 12, the I/O circuitry 1210 of the configurable IC 1200 routes different configuration data sets to different configurable nodes of the IC 1200 and in other instances utilize the configuration data to configure the I/O circuitry. For instance, FIG. 12 illustrates configurable node 1245 receiving configuration data sets 1, 3, and J through the I/O circuitry, while particular I/O circuits within the I/O circuitry 1210 receive configuration data sets 3, K, and N−1 in order to select between the various signaling parameters of the various supported external interfaces. In some embodiments, the configuration data sets are stored within each configurable node or with the configurable I/O circuits. Specifically, the configuration data sets are stored in configuration data storage memory associated with one or more of the nodes or I/O circuits. Also, in some embodiments, a configurable node can store multiple configuration data sets so that it can reconfigure quickly by changing to another configuration data set. In some embodiments, some configurable nodes store only one configuration data set, while other configurable nodes store multiple such data sets.

Figure 13:
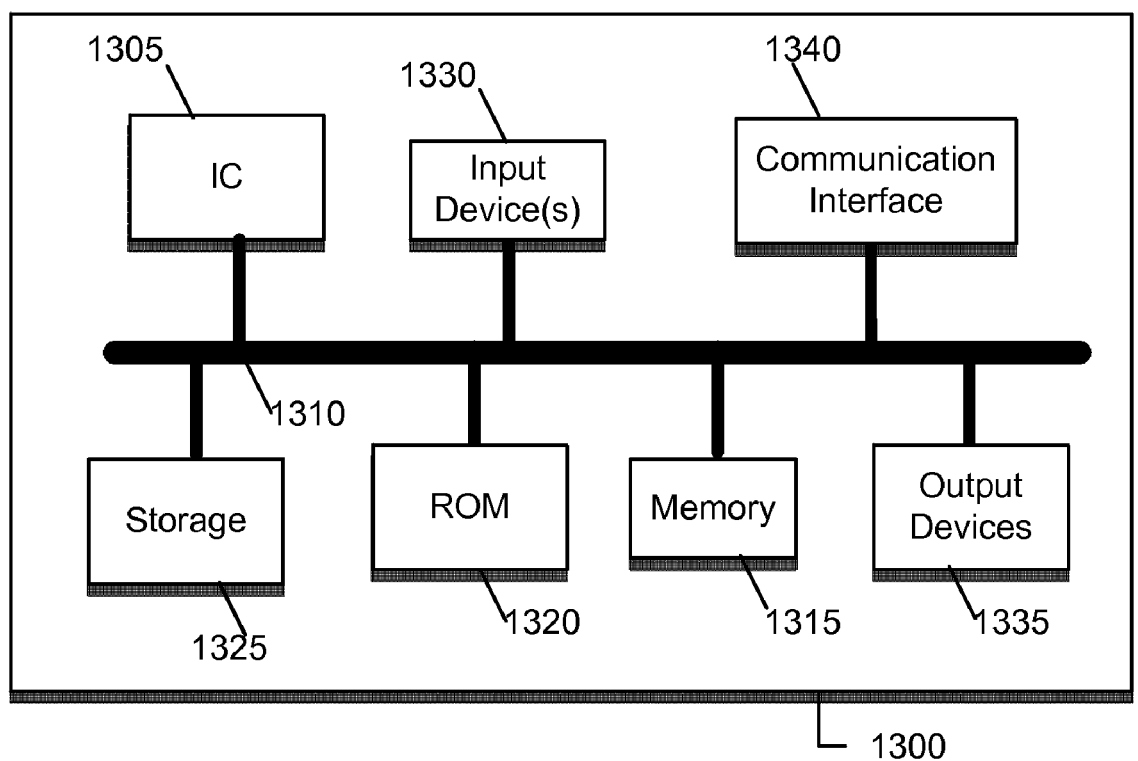
FIG. 13 conceptually illustrates a more detailed example of a computing system that has an IC, which includes one of the invention's configurable circuit arrangements.

FIG. 13 conceptually illustrates a more detailed example of a computing system 1300 that has an IC 1305, which includes one of the invention's configurable circuit arrangements that were described above. The system 1300 can be a stand-alone computing or communication device, or it can be part of another electronic device. As shown in FIG. 13, the system 1300 not only includes the IC 1305, but also includes a bus 1310, a system memory 1315, a read-only memory 1320, a storage device 1325, input devices 1330, output devices 1335, and communication interface 1340.

The bus 1310 collectively represents all system, peripheral, and chipset interconnects (including bus and non-bus interconnect structures) that communicatively connect the numerous internal devices of the system 1300. For instance, the bus 1310 communicatively connects the IC 1310 with the read-only memory 1320, the system memory 1315, and the permanent storage device 1325. The bus 1310 may be any of several types of bus structure including a memory bus or memory controller, a peripheral bus, and a local bus using any of a variety of conventional bus architectures. For instance, the bus 1310 architecture may include any of the following standard architectures: PCI, PCI-Express, VESA, AGP, Microchannel, ISA and EISA, to name a few.

From these various memory units, the IC 1305 receives data for processing and configuration data for configuring the ICs configurable logic and/or interconnect circuits. When the IC 1305 has a processor, the IC also retrieves from the various memory units instructions to execute. The read-only-memory (ROM) 1320 stores static data and instructions that are needed by the IC 1305 and other modules of the system 1300.

Some embodiments of the invention use a mass-storage device (such as a magnetic disk to read from or write to a removable disk or an optical disk for reading a CD-ROM disk or to read from or write to other optical media) as the permanent storage device 1325. Other embodiments use a removable storage device (such as a flash memory card or memory stick) as the permanent storage device. The drives and their associated computer-readable media provide non-volatile storage of data, data structures, computer-executable instructions, etc. for the system 1300. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 1325, the system memory 1315 is a read-and-write memory device. However, unlike storage device 1325, the system memory is a volatile read-and-write memory, such as a random access memory. Typically, system memory 1315 may be found in the form of random access memory (RAM) modules such as SDRAM, DDR, RDRAM, and DDR-2. The system memory stores some of the set of instructions and data that the processor needs at runtime.

The bus 1310 also connects to the input and output devices 1330 and 1335. The input devices enable the user to enter information into the system 1300. The input devices 1330 can include touch-sensitive screens, keys, buttons, keyboards, cursor-controllers, touch screen, joystick, scanner, microphone, etc. The output devices 1335 display the output of the system 1300. The output devices include printers and display devices, such as cathode ray tubes (CRT), liquid crystal displays (LCD), organic light emitting diodes (OLED), plasma, projection, etc.

Finally, as shown in FIG. 13, bus 1310 also couples system 1300 to other devices through a communication interface 1340. Examples of the communication interface include network adapters that connect to a network of computers, or wired or wireless transceivers for communicating with other devices. Through the communication interface 1340, the system 1300 can be a part of a network of computers (such as a local area network ("LAN"), a wide area network ("WAN"), or an Intranet) or a network of networks (such as the Internet).

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. An integrated circuit (IC) comprising:
   a) a configurable input/output (I/O) circuit comprising:
      a first set of configurable drivers for passing signals between the IC and a first external interface specifying a first set of operating parameters;
      a second set of configurable drivers for passing signals between the IC and a second external interface specifying a second set of operating parameters; and
   b) a storage for simultaneously storing first and second sets of configuration data, wherein the first set of configuration data configures the IC to enable the first set of configurable drivers while disabling the second set of configurable drivers, and the second set of configuration data configures the IC during a run-time operation of the IC to enable the second set of configurable drivers while disabling the first set of configurable drivers.

2. The IC of claim 1, wherein (i) the first set of operating parameters specifies a first operating voltage for the signals passing between the IC and the first external interface and (ii) the second set of operating parameters specifies a second operating voltage for the signals passing between the IC and the second external interface, wherein the first and second operating voltages are different.

3. The IC of claim 2, wherein (i) the first set of operating parameters further specifies a first operating frequency for the signals passing between the IC and the first external interface and (ii) the second set of operating parameters further specifies a second operating frequency for the signals passing between the IC and the second external interface, wherein the first and second operating frequencies are different.

4. The IC of claim 3, wherein the first set of configurable drivers comprises circuits that withstand the first operating voltage while producing a first current sufficient to produce the first operating frequency for the first external interface, wherein the second set of configurable drivers comprises circuits that withstand the second operating voltage while producing a second current sufficient to produce the second operating frequency for the second external interface.

5. The IC of claim 1, wherein the configurable I/O circuit further comprises an isolation device for isolating the second set of configurable drivers from the signals passing through the first set of configurable drivers with the first set of operating parameters.

6. The IC of claim 5, wherein the isolation device is inactive when the signals with the second set of operating parameters pass through the second set of configurable drivers.

7. The IC of claim 5, wherein the first set of configuration data further selectively enables the isolation device to isolate the second set of configurable drivers when the first set of configuration data enables the first set of configurable drivers to pass the signals.

8. The IC of claim 7, wherein the second set of configuration data disables the isolation device when the second set of configuration data enables the second set of configurable drivers to pass the signals.

9. The IC of claim 7, wherein the configurable I/O circuit further comprises an output line, wherein the first and second configurable drivers pass the signals through the output line and the isolation device is located along the output line in between the first and second sets of configurable drivers.

10. The IC of claim 5, wherein the isolation device comprises at least one circuit that selectively prevents the signals passing from the first set of configurable drivers from reaching the second set of configurable drivers.

11. A method of configuring an input/output (I/O) circuit of an integrated circuit (IC), the method comprising:
   simultaneously storing at the IC first and second sets of configuration data;
   configuring the I/O circuit using the first set of configuration data to convert between signals conforming to internal operating parameters of the IC and signals conforming to external operating parameters of a first external interface; and
   configuring the I/O circuit during a run-time operation of the IC using the second set of configuration data to convert between the signals conforming to the internal operating parameters of the IC and the signals conforming to the external operating parameters of a second external interface.

12. The method of claim 11, wherein the first set of configuration data enables a first set of configurable drivers of the I/O circuit to perform the conversion between the signals conforming to the internal operating parameters of the IC and the signals conforming to the external operating parameters of the first external interface.

13. The method of claim 12, wherein the second set of configuration data enables a second set of configurable drivers of the I/O circuit to perform the conversion between the signals conforming to the internal operating parameters of the IC and the signals conforming to the external operating parameters of the second external interface.

14. The method of claim 13, wherein the second set of configuration data enables an isolation device of the I/O circuit to isolate the signals passing through the second set of configurable drivers from reaching the first set of configurable drivers.

15. The method of claim 13, wherein the first set of configurable drivers comprises circuits that withstand a first voltage while producing a first current for the first external interface.

16. The method of claim 15, wherein the second set of configurable drivers comprises circuits that withstand a second voltage while producing a second current for the second external interface.

17. An integrated circuit (IC) comprising:
   a) an output pad for coupling the IC to an external interface;
   b) a configurable input/output (I/O) circuit comprising a plurality of configurable drivers, wherein each of the plurality of configurable drivers is coupled to the output pad; and
   c) a storage for storing a plurality of configuration data sets comprising a first set of configuration data for configuring each of the plurality of configurable drivers, wherein the first set of configuration data enables at least two of the configurable drivers to pass signals in parallel to the output pad, wherein the first set of configuration data disables at least one of the plurality of configurable drivers, wherein the plurality of configuration data sets further comprises a second set of configuration data for enabling at least one of the plurality of configurable drivers disabled by the first set of configuration data.

18. An integrated circuit (IC) comprising:
   a) an output pad for coupling the IC to an external interface;
   b) a configurable input/output (I/O) circuit comprising a plurality of configurable drivers, wherein each of the plurality of configurable drivers is coupled to the output pad; and
   c) a storage for storing a plurality of configuration data sets comprising a first set of configuration data for configuring each of the plurality of configurable drivers, wherein the first set of configuration data enables at least two of the configurable drivers to pass signals in parallel to the output pad, wherein the plurality of configuration data sets further comprises a second set of configuration data for disabling at least one of the plurality of configurable drivers enabled by the first set of configuration data.

19. A method for converting between signals conforming to a set of internal operating parameters of an integrated circuit (IC) and signals conforming to a set of external operating parameters of an external interface, the method comprising:
   enabling a first plurality of configurable drivers of a configurable input/output (I/O) circuit to pass the signals in parallel using a first set of configuration data; and
   passing the signals from the first plurality of configurable drivers through an output pad to the external interface, wherein the set of external operating parameters specifies an operating voltage for the signals passing between the IC and the external interface.

20. The method of claim 19, wherein the set of external operating parameters further specifies an operating frequency for the signals passing between the IC and the external interface.

21. The method of claim 19, further comprising:
   enabling a second plurality of configurable drivers of the configurable I/O circuit to pass the signals in parallel using a second set of configuration data, wherein the first plurality of configurable drivers and the second plurality of configurable drivers are different; and
   passing the signals from the second plurality of configurable drivers through the output pad to the external interface.

22. The method of claim 19 further comprising stabilizing the signals at the output pad using said first plurality of configurable drivers.

23. An integrated circuit (IC) comprising:
   a) a configurable input/output (I/O) circuit comprising:
      a first configurable driver for passing signals between the IC and a first external interface specifying a first set of operating parameters;
      a second configurable driver for passing signals between the IC and a second external interface specifying a second set of operating parameters; and
      an isolation device for isolating the second configurable driver from the signals passing between the first configurable driver and the first external interface; and
   b) a storage for storing a set of configuration data for selectively enabling one of the first and second configurable drivers while disabling the other unselected configurable driver.

24. The IC of claim 23, wherein the isolation device comprises a transfer gate for preventing the signals passing between the first configurable driver and the first external interface from reaching the second configurable driver when the first configurable driver is enabled.

25. The IC of claim 23, wherein the isolation device comprises a leakage regulating transistor for preventing leakage current from the first configurable driver from reaching the second configurable driver when the first configurable driver is enabled.

26. The IC of claim 23, wherein (i) the first set of operating parameters specifies a first operating voltage for the signals passing between the IC and the first external interface and (ii) the second set of operating parameters specifies a second operating voltage for the signals passing between the IC and the second external interface, wherein the first and second operating voltages are different.

27. The IC of claim 26, wherein (i) the first set of operating parameters further specifies a first operating frequency for the signals passing between the IC and the first external interface and (ii) the second set of operating parameters further specifies a second operating frequency for the signals passing between the IC and the second external interface, wherein the first and second operating frequencies are different.

* * * * *